(12) United States Patent
Zhang

(10) Patent No.: US 11,164,921 B2
(45) Date of Patent: Nov. 2, 2021

(54) ARRAY SUBSTRATE, METHOD OF MANUFACTURING THEREOF, AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Xingyong Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 133 days.

(21) Appl. No.: 16/472,910

(22) PCT Filed: Jan. 15, 2019

(86) PCT No.: PCT/CN2019/071722
§ 371 (c)(1),
(2) Date: Jun. 24, 2019

(87) PCT Pub. No.: WO2020/118842
PCT Pub. Date: Jun. 18, 2020

(65) Prior Publication Data
US 2020/0219949 A1  Jul. 9, 2020

(30) Foreign Application Priority Data
Dec. 13, 2018 (CN) .......................... 201811527068.X

(51) Int. Cl.
*H01L 27/32* (2006.01)
*H01L 51/56* (2006.01)
(Continued)

(52) U.S. Cl.
CPC ...... *H01L 27/3246* (2013.01); *H01L 27/3248* (2013.01); *H01L 51/0011* (2013.01);
(Continued)

(58) Field of Classification Search
CPC ............ H01L 27/3246; H01L 27/3248; H01L 2227/323; H01L 51/0011; H01L 51/56; H01L 51/5012; H01L 51/5256
See application file for complete search history.

(56) References Cited

U.S. PATENT DOCUMENTS 7,408,192 B2 *  8/2008  Kang ................. H01L 51/0013
                                                   257/59
9,391,304 B2 *  7/2016  Lee ......................... H01L 51/56
(Continued)

FOREIGN PATENT DOCUMENTS

CN   101055889 A   10/2007
CN   105097882 A   11/2015
(Continued)

*Primary Examiner* — Maliheh Malek
(74) *Attorney, Agent, or Firm* — Mark M. Friedman

(57) ABSTRACT

An array substrate, a method of manufacturing thereof, and a display device are provided. The array substrate includes a substrate, an array layer disposed on the substrate, an anode trace layer disposed on the array layer, a first pixel defining layer being an inorganic layer and disposed on the array layer, a first opening extending through the first pixel defining layer, a second pixel defining layer disposed on the first pixel defining layer, and a second opening extending through the second pixel defining layer. A projection of the first opening defined on the array layer completely falls within a projection of the second opening defined on the array layer. A light emitting region is defined by forming two pixel defining layers, so a color mixing problem is
(Continued)

improved, and a pixel defining layer made of an inorganic material can improve a moisture barrier property of a pixel region.

6 Claims, 4 Drawing Sheets

(51) Int. Cl.
*H01L 51/00* (2006.01)
*H01L 51/50* (2006.01)

(52) U.S. Cl.
CPC .......... *H01L 51/56* (2013.01); *H01L 51/5012* (2013.01); *H01L 2227/323* (2013.01)

(56) References Cited

U.S. PATENT DOCUMENTS

| | | | | |
|---|---|---|---|---|
| 9,466,648 | B2* | 10/2016 | Kim | H01L 27/3246 |
| 9,614,180 | B2* | 4/2017 | Kang | H01L 51/5253 |
| 9,660,005 | B2* | 5/2017 | Jun | H01L 27/3248 |
| 10,263,054 | B2* | 4/2019 | Kim | H01L 27/3218 |
| 10,340,387 | B2* | 7/2019 | Li | H01L 21/76895 |
| 10,446,630 | B2* | 10/2019 | Yu | H01L 27/3262 |
| 10,546,903 | B2* | 1/2020 | Li | H01L 51/5206 |
| 10,665,649 | B2* | 5/2020 | Cao | H01L 27/3244 |
| 10,719,151 | B2* | 7/2020 | Ye | H01L 51/5221 |
| 10,749,143 | B2* | 8/2020 | Lin | H01L 51/5278 |
| 10,782,837 | B2* | 9/2020 | Ye | H01L 27/323 |
| 10,784,326 | B2* | 9/2020 | Cao | H01L 51/5056 |
| 10,790,458 | B2* | 9/2020 | Yu | H01L 51/003 |
| 10,797,120 | B2* | 10/2020 | Zhang | H01L 51/5253 |
| 10,803,798 | B2* | 10/2020 | Li | G09G 3/3233 |
| 10,804,349 | B2* | 10/2020 | Wu | H01L 51/0097 |
| 10,804,478 | B2* | 10/2020 | Fang | H01L 29/78645 |
| 10,818,696 | B2* | 10/2020 | Yang | H01L 27/1248 |
| 10,818,855 | B2* | 10/2020 | Li | H01L 51/003 |
| 10,824,201 | B2* | 11/2020 | Bai | H01L 27/3276 |
| 10,847,589 | B2* | 11/2020 | Xiang | H01L 27/3246 |
| 10,847,596 | B2* | 11/2020 | Bu | H01L 27/1218 |
| 10,847,732 | B2* | 11/2020 | Bai | H01L 27/3262 |
| 10,861,912 | B2* | 12/2020 | Guo | H01L 51/5253 |
| 10,861,919 | B2* | 12/2020 | Ding | H01L 27/3262 |
| 10,868,098 | B2* | 12/2020 | Chen | H01L 27/3265 |
| 10,868,263 | B2* | 12/2020 | Yang | G06F 1/1652 |
| 10,879,328 | B2* | 12/2020 | Yu | H01L 27/3246 |
| 10,879,495 | B2* | 12/2020 | Huang | H01L 51/5275 |
| 10,879,498 | B2* | 12/2020 | Wang | H01L 27/323 |
| 2006/0124933 | A1* | 6/2006 | Kang | H01L 27/3244 257/59 |
| 2007/0241671 | A1 | 10/2007 | Kai et al. | |
| 2008/0078991 | A1* | 4/2008 | Kim | H01L 51/56 257/40 |
| 2010/0102715 | A1* | 4/2010 | Suh | H01L 51/56 313/504 |
| 2012/0007057 | A1* | 1/2012 | Choi | H01L 51/56 257/40 |
| 2012/0012848 | A1* | 1/2012 | Suh | H01L 51/0013 257/59 |
| 2013/0001603 | A1* | 1/2013 | Lim | H01L 51/5209 257/88 |
| 2014/0319475 | A1* | 10/2014 | Joo | H01L 27/3246 257/40 |
| 2014/0353612 | A1* | 12/2014 | Hwang | H01L 27/3246 257/40 |
| 2015/0008398 | A1* | 1/2015 | Lee | H01L 51/5228 257/40 |
| 2015/0014636 | A1* | 1/2015 | Kang | H01L 27/3258 257/40 |
| 2015/0060810 | A1* | 3/2015 | Han | H01L 27/3246 257/40 |
| 2015/0137090 | A1* | 5/2015 | Lee | H01L 51/5225 257/40 |
| 2015/0188093 | A1* | 7/2015 | Kim | H01L 51/5218 257/40 |
| 2016/0043320 | A1* | 2/2016 | Kwon | B41M 5/42 156/230 |
| 2016/0111688 | A1* | 4/2016 | Lee | H01L 27/3246 257/40 |
| 2016/0126466 | A1* | 5/2016 | Jeong | H01L 51/006 257/40 |
| 2016/0293683 | A1* | 10/2016 | Hou | H01L 51/001 |
| 2016/0329388 | A1* | 11/2016 | Yokota | H01L 27/3246 |
| 2017/0005286 | A1* | 1/2017 | Yun | H01L 27/3211 |
| 2017/0047556 | A1* | 2/2017 | Lee | H01L 51/56 |
| 2017/0194395 | A1 | 7/2017 | Hu et al. | |
| 2018/0033832 | A1* | 2/2018 | Park | H01L 27/323 |
| 2018/0033842 | A1* | 2/2018 | Bae | H01L 27/156 |
| 2018/0033844 | A1 | 2/2018 | Liao | |
| 2018/0033968 | A1* | 2/2018 | Lee | H01L 51/5088 |
| 2018/0138251 | A1* | 5/2018 | Kang | H01L 51/5253 |
| 2018/0190739 | A1* | 7/2018 | Paek | H01L 51/5209 |
| 2018/0190740 | A1* | 7/2018 | Bang | H01L 51/56 |
| 2019/0013363 | A1* | 1/2019 | Joo | H01L 27/3211 |
| 2019/0074337 | A1* | 3/2019 | Xie | H01L 27/3258 |
| 2019/0081122 | A1* | 3/2019 | Kim | H01L 51/5253 |
| 2019/0096968 | A1* | 3/2019 | Zhang | H01L 51/56 |
| 2019/0096970 | A1 | 3/2019 | Hou | |
| 2019/0096974 | A1* | 3/2019 | Kim | H01L 51/0097 |
| 2019/0165059 | A1 | 5/2019 | Hou | |
| 2019/0221622 | A1* | 7/2019 | Kim | H01L 27/3246 |
| 2019/0237527 | A1* | 8/2019 | Lee | H01L 27/3246 |
| 2019/0288043 | A1* | 9/2019 | Shin | H01L 51/5215 |
| 2019/0334123 | A1* | 10/2019 | Zhang | H01L 51/5256 |
| 2019/0348491 | A1* | 11/2019 | Chung | H01L 27/3276 |
| 2020/0043998 | A1* | 2/2020 | Choi | H01L 27/3246 |
| 2020/0108586 | A1* | 4/2020 | Ryu | C09J 7/20 |
| 2020/0152717 | A1* | 5/2020 | Hwang | H01L 51/0015 |
| 2020/0161576 | A1* | 5/2020 | Hsu | H01L 27/3246 |
| 2020/0185468 | A1* | 6/2020 | Zhang | H01L 51/56 |
| 2020/0212143 | A1* | 7/2020 | Jeong | H01L 51/0011 |
| 2020/0286965 | A1* | 9/2020 | Lim | H01L 27/3223 |
| 2020/0350513 | A1* | 11/2020 | Park | H01L 51/56 |
| 2020/0357868 | A1* | 11/2020 | Cui | H01L 51/00 |
| 2020/0379604 | A1* | 12/2020 | Xia | H01L 27/323 |
| 2020/0381497 | A1* | 12/2020 | Zhang | H01L 27/3246 |
| 2021/0184164 | A1* | 6/2021 | Gong | H01L 51/56 |
| 2021/0249624 | A1* | 8/2021 | Lou | H01L 51/56 |

FOREIGN PATENT DOCUMENTS

| | | |
|---|---|---|
| CN | 105448957 A | 3/2016 |
| CN | 107591432 A | 1/2018 |
| CN | 107706222 A | 2/2018 |
| CN | 107731871 A | 2/2018 |
| CN | 108010946 A | 5/2018 |

* cited by examiner

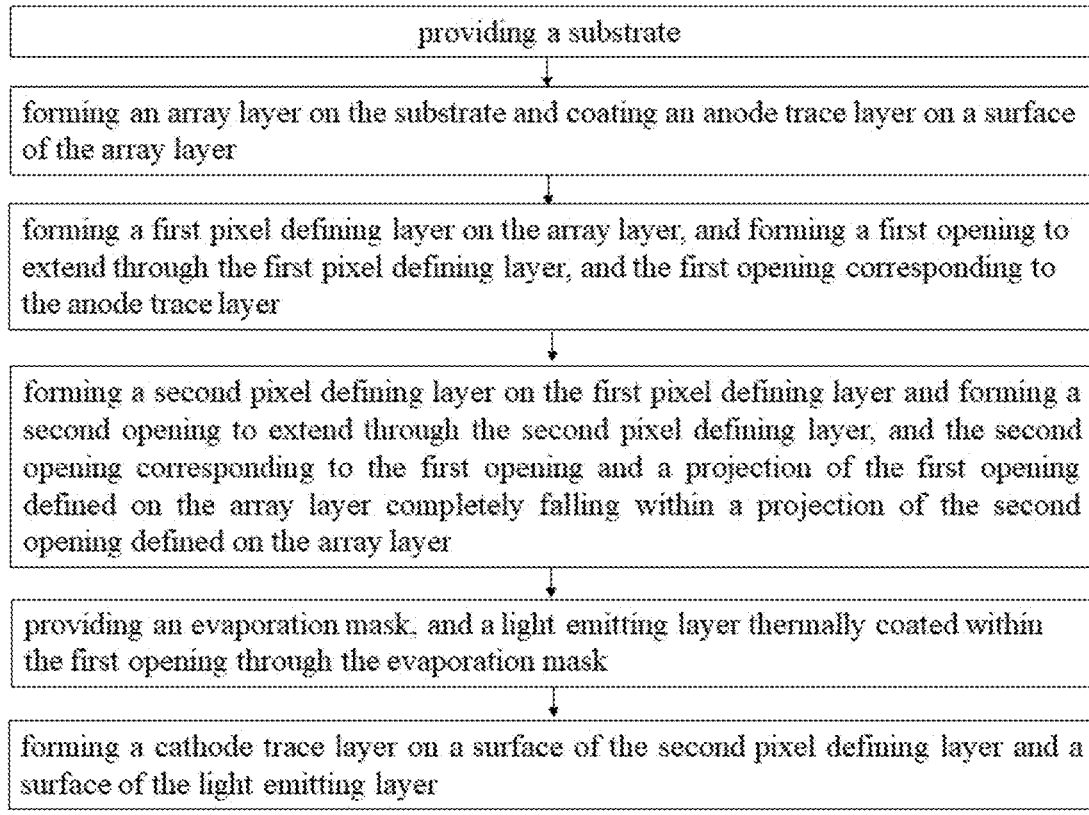
FIG. 5
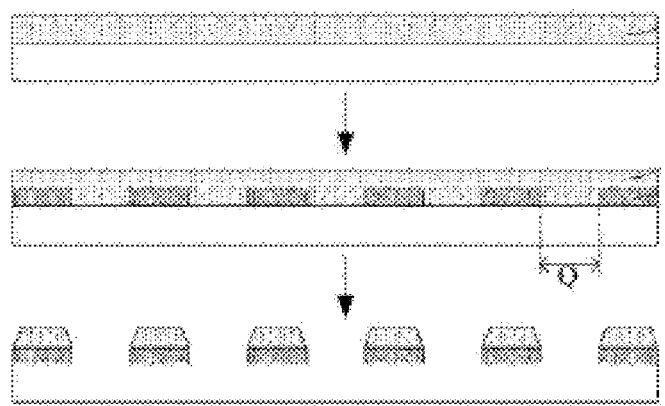
FIG. 6, Prior Art

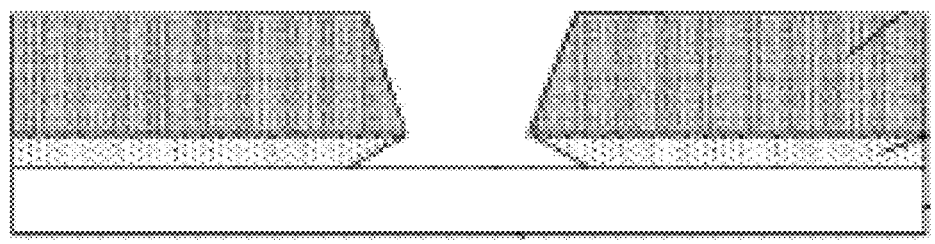
FIG. 7, Prior Art
FIG. 8

ARRAY SUBSTRATE, METHOD OF MANUFACTURING THEREOF, AND DISPLAY DEVICE

BACKGROUND OF INVENTION

Field of Invention

The present invention relates to a field of display technology, and more particularly, to an array substrate, a method of manufacturing thereof, and a display device.

Description of Prior Art

Organic lighting emitting diode devices are referred to as OLED devices. The OLED devices have advantages of self-luminescence, rich color images, fast response times, wide viewing angles, and are light weight, so the OLED devices have been in focus. However, manufacturing the OLED devices have potential risks and even affect device quality. For example, a pixel defining layer is affected. Conventionally, the pixel defining layer is formed by one-time exposure development. Although the technique is relatively simple, a pixel region is easily affected by color mixing and has a poor anti-moisture property.

In the prior art, a method of manufacturing an organic electroluminescent layer of the OLED devices includes a vacuum evaporation, which is suitable for small organic molecules, and the organic electroluminescent layer can be formed without a solvent, and films disposed on the devices have a uniform thickness, but the equipment investment is high and a material utilization rate is low, which is not suitable for manufacturing large-sized devices. The organic electroluminescent layer is formed by using a solution including organic electroluminescent materials, and processes include spin coating, inkjet printing, spray nozzle coating, etc., which are suitable for polymer materials and soluble small molecules and have low cost equipment and outstanding benefits in large-scale and large-scale production. In particular, inkjet printing can accurately inject a solution into a pixel region to form an organic electroluminescent layer. However, the solution including the organic electroluminescent materials is difficult to form an organic electroluminescent layer having a uniform thickness in the pixel region.

Referring FIG. 6, China Patent No. CN106784409A discloses that a first film layer, considered as a pixel defining layer, is formed on a substrate by inkjet printing or spin coating, and then a second film layer is formed directly under the first film layer by inkjet printing. The first film layer corresponding hollowed-out positions of mesh-shaped organic second film layer is then removed to form a pixel defining layer, which cannot solve the problem of color mixing.

Referring to FIG. 7, China patent CN104393192A discloses that a pixel defining layer includes a first pixel defining layer and a second pixel defining layer stacked on the first pixel defining layer. A cross section of the first pixel defining layer is a narrow trapezoid. A cross section of the second pixel defining layer is an inverted trapezoid. The first pixel defining layer is a hydrophilic negative photoresist and the second pixel defining layer is a hydrophobic positive photoresist. Two pixel defining layers are formed by coating, exposing, and developing. Although it is beneficial to avoid a short circuit of an anode and a cathode and a cathode open circuit, vapor deposition is difficultly employed in an inverted trapezoidal region. Therefore, it is difficult to satisfy all the electroluminescent materials in the inverted trapezoidal region.

SUMMARY OF INVENTION

According to one embodiment, an array substrate includes a substrate; an array layer disposed on the substrate, an anode trace layer disposed on the array layer, a first pixel defining layer which is an inorganic layer and disposed on the array layer, a first opening extending through the first pixel defining layer, a second pixel defining layer disposed on the first pixel defining layer, and a second opening extending through the second pixel defining layer. A projection of the first opening defined on the array layer completely falls within a projection of the second opening defined on the array layer.

In one embodiment, the array substrate further includes a light emitting layer covering a surface of the anode trace layer and filling the first opening.

In one embodiment, the first opening and the second opening are defined as a stepped structure, and an inner edge of the second opening is at a distance of 100-200 nm from an inner edge of the first opening.

In one embodiment, the first opening includes:
a first upper bottom surface facing the second opening; and
a second lower bottom surface facing the anode trace layer; and
a width of the first opening is sequentially decreased from the first upper bottom surface to the first lower bottom surface; and
the second opening includes:
a second upper bottom surface facing away from the first opening; and
a second lower bottom surface facing the first opening; and
a width of the second opening is sequentially decreased from the second upper bottom surface to the second lower bottom surface.

In one embodiment, a material the first pixel defining layer is an inorganic material, and the inorganic material includes any one of silicon nitride, silicon oxynitride, and silicon oxide; and a material the second pixel defining layer is an organic material, and the organic material includes any one of acrylic, polyimide, and epoxy.

According to another embodiment, a method of manufacturing an array substrate includes following steps:
S1 providing a substrate;
S2 forming an array layer on the substrate, wherein the array layer is coated with an anode trace layer;
S3 forming a first pixel defining layer on the array layer and forming a first opening to extend through the first pixel defining layer, wherein the first opening corresponds to the anode trace layer;
S4 forming a second pixel defining layer on the first pixel defining layer and forming a second opening to extend through the second pixel defining layer, and the second opening corresponds to the first opening and a projection of the first opening defined on the array layer completely falls within a projection of the second opening defined on the array layer.

In one embodiment, the S3 step further includes depositing an inorganic material on the array layer to form an inorganic layer by vapor deposition, patterning the inorganic layer by exposure and development, and forming the first defining layer and forming the pixel defining layer and the first opening by dry etching.

In one embodiment, a shape of the evaporation mask conforms to the first opening in the S5.

In one embodiment, packaging the array substrate and forming an inorganic film layer on the second pixel layer by chemical vapor deposition; forming an organic film layer on the first inorganic film layer by inkjet printing; and forming a second inorganic layer on the organic film layer by chemical vapor deposition.

In further embodiment, a display device includes above-mentioned array substrate.

An array substrate, a method of manufacturing thereof, and a display device have beneficial effects that a light emitting region is defined by forming two pixel defining layers, so a problem of color mixing is improved, and a pixel defining layer made of an inorganic material can improve moisture barrier property of the pixel region.

BRIEF DESCRIPTION OF DRAWINGS

FIG. 5 is a flowchart of a method of manufacturing the array substrate according to one embodiment.

FIG. 6 is a schematic view of a pixel defining layer in the prior art that cannot solve color mixing problems.

FIG. 7 is a schematic view of a pixel defining layer in the prior art that cannot solve evaporation problems.

FIG. 8 is a schematic view of a display device according to one embodiment.

Figure 1:
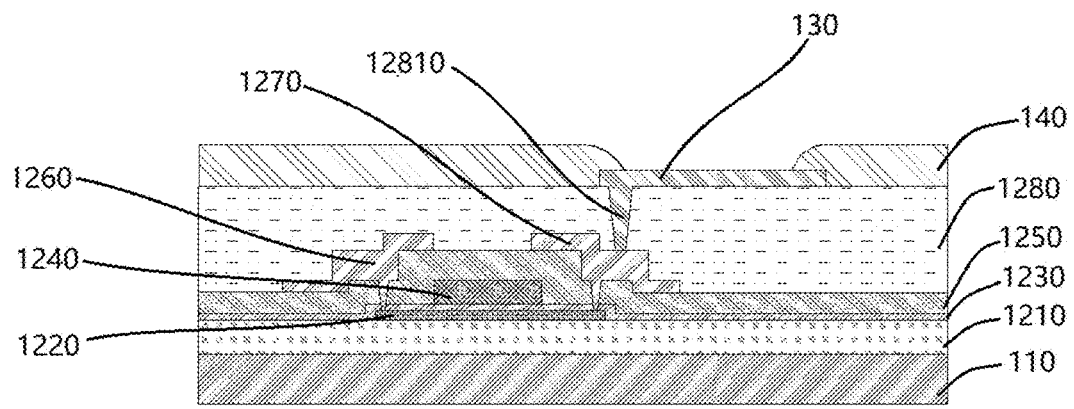
FIG. 1 is a schematic view of forming a first pixel defining layer of an array substrate according one embodiment.

display device 100; array substrate 10; substrate 110; array layer 120; anode trace layer 130; first defining layer 140; second pixel defining layer 150; light emitting layer 160; cathode trace layer 170; packaging layer 180; buffer layer 1210; active layer 1220; first insulating layer 1230; gate trace 1240; second insulating layer 1250; source 1260; drain 1270; third insulating layer 1280; via hole 12810; first opening 1410; second opening 1510; inorganic film layer 1810; organic film layer 1820; and second inorganic layer 1830.

DETAILED DESCRIPTION OF PREFERRED EMBODIMENTS

Figure 4:
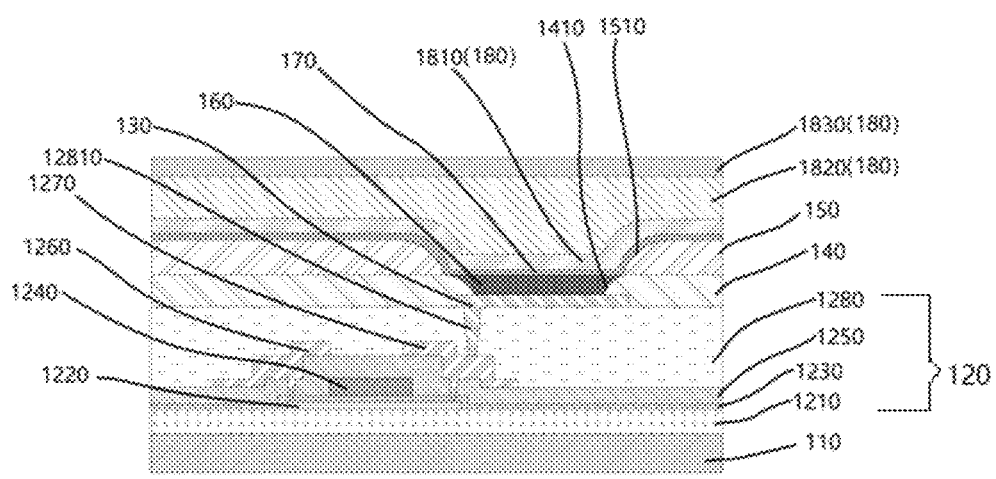
FIG. 4 is a schematic view of the array substrate according to one embodiment.

Referring to FIG. 4, an array substrate 10 according to one embodiment includes a substrate 110, an array layer 120, an anode trace layer 130, a first pixel defining layer 140, a second pixel defining layer 150, a light emitting layer 160, and a cathode trace layer 170.

The array layer 120 includes a buffer layer 1210, an active layer 1220, a first insulating layer 1230, a gate trace 1240, a second insulating layer 1250, a source 1260, a drain 1270, and a third insulating layer 1280. The active layer 1220 is disposed on the buffer layer 1210. The first insulating layer 1230 covers the active layer 1220 and the buffer layer 1210. The gate trace 1240 is disposed on the first insulating layer 1230. The second insulating layer 1250 covers the gate trace 1240. The source 1260 and the drain 1270 are disposed on the second insulating layer 1250. The source 1260 and the drain 1270 are both electrically connected to the active layer 1220. The third insulating layer 1280 covers the source 1260 and the drain 1270.

The anode trace layer 130 is formed on the third insulating layer 1280. The third insulating layer 1280 has a via hole 12810, and the anode trace layer 130 is electrically connected to the drain 1270 through the via hole 12810.

Referring to FIG. 1, the first pixel defining layer 140 is an inorganic layer having a thickness of 300-500 nm, and the inorganic layer is made of silicon nitride, silicon oxynitride, silicon oxide, etc. The first pixel defining layer 140 is disposed on the anode trace layer 130 and the array layer 120, and the first pixel defining layer 140 is provided with a first opening 1410 corresponding to the anode trace layer 130 region.

Figure 2:
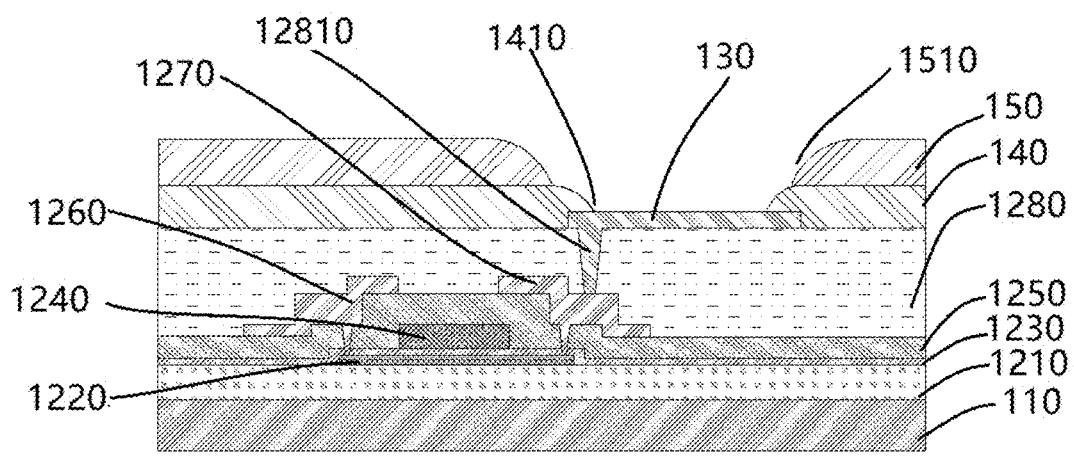
FIG. 2 is a schematic view of forming a second pixel defining layer of the array substrate according one embodiment.

Referring to FIG. 2, the second pixel defining layer 150 is an organic layer made of acrylic, polyimide, epoxy resin, etc., having a thickness of about 1000 nm, and the second pixel defining layer 150 is disposed on the first pixel defining layer 140. The second pixel defining layer 150 is provided with a second opening 1510 corresponding to the first opening 1410 region.

Figure 3:
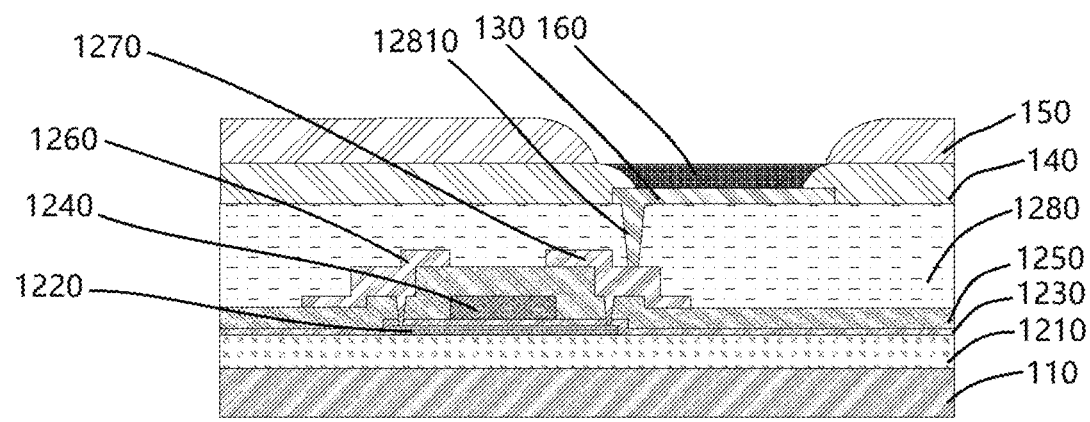
FIG. 3 is a schematic view of forming a light emitting layer of the array substrate according to one embodiment.

Referring to FIG. 3, a light emitting layer 160 is formed on the anode trace layer 130 and fills the first opening 1410.

An edge of the light emitting layer 160 is thinned during a vapor deposition process, and thus an emission effect of a display region is affected so as to form a shadow. In order to avoid this phenomenon, the first open region 1410 and the second open region 1510 are staggered from each other on an inner side of the open region so as to form a certain distance. Specifically, an inner edge of the second opening 1510 is at a distance of 100-200 nm from an inner edge of the first opening 1410. Thus, when the light emitting layer 160 fills the first opening 1410 region, the shadow caused by the vapor deposition process is limited at an edge of the first opening 1410 and the second opening 1510 region, which can reduce negative effects of color mixing caused by excessive shadows.

The cathode trace layer 170 is formed on the light emitting layer 160 and the second pixel defining layer 150.

Referring to FIG. 5, a method of manufacturing of an array substrate is provided according to another embodiment, and the method includes steps as follows.

S1) a substrate 110 is provided, and the substrate 110 can be selected from a flexible substrate, and material of the flexible substrate can be selected from a polyimide.

S2) an array layer 120 is formed on the substrate 110, and the array layer 120 is coated with an anode trace layer 130. In S2, the array layer 120 includes a buffer layer 1210 formed on the substrate 110, an active layer 1220 deposited on the buffer layer 1210, and a first insulating layer 1230 covering the active layer 1220, a gate trace 1240 deposited on the first insulating layer 1230, a second insulating layer 1250 covering the gate trace 1240, a source 1260 and a drain 1270 formed on the second insulating layer 1250, and a third insulating layer 1280 covering the source 1260 and the drain 1270.

S3) a first pixel defining layer 140 is formed on the array layer 120 and a first opening 1410 is formed to extend through the entire first pixel defining layer 140, and the first opening 1410 corresponds to the anode trace layer 130.

S4) a second pixel defining layer 150 is formed on the first pixel defining layer 140 and a second opening 1510 is formed to extend through the entire second pixel defining layer 150, and the second opening 1510 corresponds to the first opening 1410. A projection of the first opening 1410 defined on the array layer 120 completely falls within a projection of the second opening 1510 defined on the array layer 140.

S5) an evaporation mask is provided (not shown), and a light emitting layer 160 is thermally coated within the first opening 1410 through the evaporation mask, and a shape of the evaporation mask conforms to the first opening 1410.

S6) a cathode trace layer 170 is formed on a surface of the second pixel defining layer 150 and a surface of the light emitting layer 160.

S7) the array substrate 10 is packaged to form a packaging layer 180, and an inorganic film layer 1810 is formed on the second pixel layer 150 by chemical vapor deposition. An organic film layer 1820 is formed on the first inorganic film layer 1810 by inkjet printing. A second inorganic layer 1830 is formed on the organic film layer 1820 by chemical vapor deposition.

Referring to FIG. 8, a display device 100 is also provided according to another embodiment of the present invention, and the array substrate 10 is mainly improved, and other components are not the focus of improvement and will not be further described herein.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A method of manufacturing an array substrate comprising following steps:
   S1 providing a substrate;
   S2 forming an array layer on the substrate, wherein the array layer is coated with an anode trace layer;
   S3 forming a first pixel defining layer on the array layer and forming a first opening to extend through the first pixel defining layer, wherein the first opening corresponds to the anode trace layer;
   S4 forming a second pixel defining layer on the first pixel defining layer and forming a second opening to extend through the second pixel defining layer, wherein the second opening corresponds to the first opening and a projection of the first opening defined on the array layer completely falls within a projection of the second opening defined on the array layer;
   S5 providing an evaporation mask, wherein a light emitting layer is thermally coated within the first opening through the evaporation mask, a shape of the evaporation mask conforms to the first opening, and a top surface of the light emitting layer is aligned with a top surface of the first pixel defining layer;
   S6 forming a cathode trace layer on a surface of the second pixel defining layer and a surface of the light emitting layer; and
   S7 packaging the array substrate and forming a first inorganic film layer on the second pixel defining layer by chemical vapor deposition; forming an organic film layer on the first inorganic film layer by inkjet printing; and forming a second inorganic layer on the organic film layer by chemical vapor deposition.

2. The method of manufacturing the array substrate according to claim 1, wherein the S3 step further comprises depositing an inorganic material on the array layer to form an inorganic material layer by vapor deposition, patterning the inorganic material layer by exposure and development, and forming the first pixel defining layer and the first opening by dry etching.

3. The method of manufacturing the array substrate according to claim 1, wherein after the S7 step, the array substrate comprises:
   the substrate;
   the array layer, wherein the array layer is disposed on the substrate;
   the anode trace layer, wherein the anode trace layer is disposed on the array layer;
   the first pixel defining layer, wherein the first pixel defining layer is an inorganic layer and disposed on the array layer;
   the first opening extending through the first pixel defining layer;
   the second pixel defining layer, wherein the second pixel defining layer is disposed on the first pixel defining layer;
   the second opening extending through the second pixel defining layer; and
   the light emitting layer covering a surface of the anode trace layer and filling the first opening;
   wherein the top surface of the light emitting layer is aligned with the top surface of the first pixel defining layer; and
   wherein the projection of the first opening defined on the array layer completely falls within the projection of the second opening defined on the array layer.

4. The method of manufacturing the array substrate according to claim 3, wherein the first opening and the second opening are defined as a stepped structure, and an inner edge of the second opening is at a distance of 100-200 nm from an inner edge of the first opening.

5. The method of manufacturing the array substrate according to claim 3, wherein the first opening comprises:
   a first upper bottom surface facing the second opening; and
   a second lower bottom surface facing the anode trace layer; and
   wherein a width of the first opening is sequentially decreased from the first upper bottom surface to the first lower bottom surface; and
   the second opening comprises:
   a second upper bottom surface facing away from the first opening; and
   a second lower bottom surface facing the first opening; and
   wherein a width of the second opening is sequentially decreased from the second upper bottom surface to the second lower bottom surface.

6. The method of manufacturing the array substrate according to claim 3, wherein material of the first pixel defining layer is an inorganic material, and the inorganic material comprises any one of silicon nitride, silicon oxynitride, and silicon oxide; and
   wherein material of the second pixel defining layer is an organic material, and the organic material comprises any one of acrylic, polyimide, and epoxy.

* * * * *